April 28, 1953 H. P. MENSCH 2,636,919

GROUND CONNECTION FOR ULTRAHIGH-FREQUENCY DEVICES

Filed May 6, 1949

INVENTOR.
HARVEY P. MENSCH

BY Daly & Daly

ATTORNEYS

Patented Apr. 28, 1953

2,636,919

UNITED STATES PATENT OFFICE 2,636,919

GROUND CONNECTION FOR ULTRAHIGH-FREQUENCY DEVICES

Harvey P. Mensch, Orange, N. J., assignor to Allen B. Du Mont Laboratories, Inc., Passaic, N. J., a corporation of Delaware Application May 6, 1949, Serial No. 91,684

6 Claims. (Cl. 173—324)

This invention relates to electrical connections and particularly to methods and means for making electrical connections in apparatus for use at ultra high frequencies.

At the ultra high frequencies very small changes in physical dimensions of wiring can cause relatively large changes in electrical properties. For instance, if ordinary 22 gage solid copper hookup wire is used at a television signal frequency of 200 megacycles per second, only 1.4 inches of wire are required to resonate with 20 micromicrofarads of circuit capacitance, and 1 megacycle of detuning will result from a change in length of .007 inch of this length of wire, or alternatively from a change in its diameter of .001 inch. Under these circumstances, the inductance of a tuned circuit can be greatly changed by the presence of even a very small lump of solder at a terminal.

Manufacture and assembly, on a mass production basis, of television apparatus and the like for use at these high frequencies must employ apparatus and production methods which permit extreme mechanical precision in manufacturing, if electrical uniformity of the product is to be attained.

An object of this invention is to provide an electrical soldered connection which permits a high degree of electrical uniformity at ultra high frequencies.

Another object is to provide a means and method of soldering a circuit element to a metal chassis in which the electrical inductance of the assembly is influenced to only a minor degree by the quantity of solder used.

A further object is to provide an electrical connection particularly adaptable to the quantity production of precision apparatus.

In the drawings—

In accordance with my invention, a metal surface, such as a chassis, is pierced and dimpled. The conductive member to be connected to the metal surface is inserted into the punched hole from the convex side of the dimple. Solder is then applied to the opposite or concave side of the surface, the solder being drawn into the space around the conductive member by adherent forces. As a result of this procedure the solder can be applied quickly with little likelihood of surplus solder causing a change in inductance of the critical part.

Figure 1:
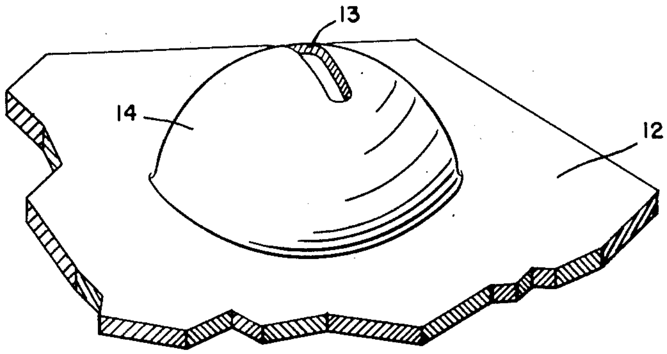
Figure 1 is a perspective view of a portion of a sheet of metal, such as a chassis, formed in accordance with my invention.

As may be seen in Figure 1, an opening 13 is provided in any well known way in a surface 12 of electrically conductive material such as metal, of which only a portion is shown. Preferably the opening 13 has an elongated configuration such as a slot. The portion of the surface surrounding the edge of the opening 13 has been formed into a dimple 14, the convex side of which is shown.

A metal tab 15 of a conductive element is inserted into the opening 13 and solder 16 is then applied, in molten state, to the concave side 17 of the dimple 14. In the molten state, the solder is attracted to the edges of the dimple and to the tab 15 by surface adherence, and is thus drawn into the space between the tab 15 and edges of the dimple 14, forming an edge 18 at a point adjacent to the convex surface of the dimple, and there solidifying into the form shown in the sectional view of Figure 2.

Lumps of solder are thus completely avoided on the convex side of the chassis, where they would, if present, cause appreciable variations in the effective inductance of the element. If more or less solder is used in the process, the variations will occur in the main mass 16 of solder, rather than in the vicinity of the edge 18.

Figure 2:
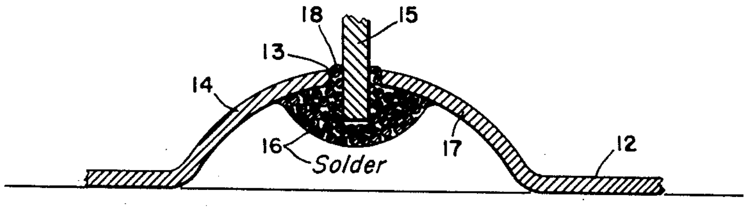
Figure 2 shows in cross section a conductive element soldered to a sheet of metal or chassis of the type shown in Figure 1.
Figure 3:
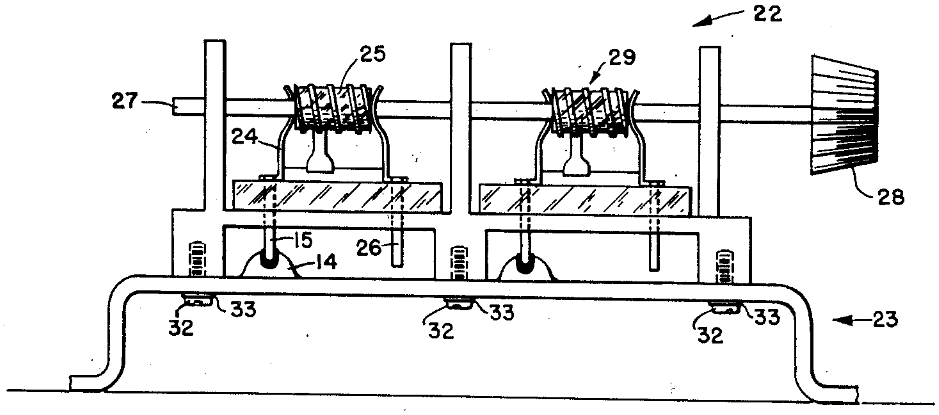
Figure 3 is a side elevation view of a part of a high frequency radio receiver such as a television receiver embodying my invention.

Referring to Figure 3, a television tuning device 22 of the type described in U. S. Patent No. 2,163,645 is shown electrically connected or "grounded" to a small chassis 23 in accordance with my invention. The chassis is provided with a slotted and dimpled portion of the type shown in Figure 1, and a tab 15 of the tuning device is soldered thereto as shown in Figure 2. The tab 15 is connected to a spring 24 making sliding contact with a rotatable tuning drum 25 and other portions of the tuning device as described in the above named patent. A second connecting tab 26 for the tuning device 22 may be connected to a tube socket or other well known circuit element mounted in conventional manner in the chassis. As explained in the above mentioned patent, the tuning device 22 may have a shaft 27 rotated by a knob 28 and may also have another tuning section or sections 29 ganged on the same shaft. The tuning device 22 is preferably attached mechanically to the chassis 23 by screws 32 having lock washers 33 under their heads. The tuning device 22 is also preferably provided with a metal cover (not shown) which serves the functions of an electrical shield and protection against dust and mechanical injury.

In the preferred manufacturing process, the tuning element 22, complete with cover, is placed in contact with a chassis 23 slotted and dimpled as shown in Figure 1, and secured in position by means of screws 32. This arrangement locates the tab or tabs 15 in the slotted dimple or dimples 14. The chassis is then inverted and solder is applied in the concave side of the dimple 14, where it runs into the slot to a position determined by adhesive forces as explained in conjunction with Figure 2.

Although specific embodiments of my invention have been illustrated and described above, its scope can best be understood from the following claims.

What is claimed is:

1. In ultra high frequency electrical apparatus, a laterally extending metal sheet, an inductance element adjacent thereto, and a conductor connecting said element and said sheet, said sheet having an indented portion and an opening therein, said conductor extending into said opening from the convex side of said portion with the end thereof terminating in the concave side of said portion, and solder in the concave side of said portion connecting said conductor to said sheet.

2. In an electrical device for manufacture in mass production and requiring a high degree of uniformity between units, a laterally extending metal surface and a reactive element having a connector extending therefrom, said surface having an extruded portion forming a part thereof and having an opening therein, and extending toward said connector and soldered thereto, said connector extending through said opening terminating beneath said portion, the bulk of solder being also beneath said portion.

3. An inductive element and an end termination therefor, said end termination comprising a sheet-like electrical conductor having a dimple formed therein and having an opening near the apex of said dimple, said inductive element comprising an elongated electrically conductive member positioned to have an end portion thereof pass through said opening from the convex side of said dimple, and solder positioned within the concave portion of said dimple and electrically connecting said end portion of said inductive element to said conductor.

4. The device in accordance with claim 3, in which said solder extends into said opening.

5. An ultra high frequency device comprising a laterally extending conductive chassis having a dimple formed therein convex on the side thereof adjacent said reactive element and a slot located in said dimple, a reactive element located adjacent said slot and secured mechanically to said chassis, said reactive element having a terminal extending through said slot, and solder joining said terminal to said chassis, said solder being on the side of said chassis opposite said reactive element within the concave portion of said dimple.

6. An ultra high frequency device comprising a laterally extending conductive chassis member having a slot-like opening therein and a curvature therein adjacent said opening, a reactive element forming part of a tuned circuit located adjacent said opening and secured mechanically to said chassis, said reactive element having a terminal lead extending therefrom and through said opening, said lead having reactance which forms a substantial part of the tuning of said reactive element, changes in length or diameter of said lead of less than ten per cent varying the tuning of said reactive element, and solder joining said terminal lead to said chassis, said solder being within the concave portion of said curvature on the side of said chassis opposite said reactive element.

HARVEY P. MENSCH.

References Cited in the file of this patent

UNITED STATES PATENTS

| Number | Name | Date |
|---|---|---|
| 2,244,009 | Heinsch | June 3, 1941 |
| 2,270,337 | Pensak | Jan. 20, 1942 |
| 2,276,617 | Kreienfeld | Mar. 17, 1942 |
| 2,476,404 | Del Camp | July 19, 1949 |

FOREIGN PATENTS

| Number | Country | Date |
|---|---|---|
| 63,892 | Denmark | Sept. 3, 1945 |
| 497,739 | France | Dec. 16, 1919 |